United States Patent [19]

Rasche et al.

[11] Patent Number: 5,644,234
[45] Date of Patent: Jul. 1, 1997

[54] MR METHOD AND MR DEVICE FOR IMPLEMENTING THE METHOD

[75] Inventors: Volker Rasche; Peter Röschmann, both of Hamburg, Germany

[73] Assignee: U.S. Philips Corporation, New York, N.Y.

[21] Appl. No.: 610,024

[22] Filed: Mar. 4, 1996

[30] Foreign Application Priority Data

Mar. 4, 1995 [DE] Germany ............................. 19507617

[51] Int. Cl.⁶ ............................................. G01R 33/20
[52] U.S. Cl. ........................ 324/318; 128/653.2; 324/309
[58] Field of Search ..................................... 324/318, 322, 324/309, 307, 300; 128/653.2, 653.5

[56] References Cited

U.S. PATENT DOCUMENTS

| | | | |
|---|---|---|---|
| 5,271,400 | 12/1993 | Dumoulin et al. | 128/653.2 |
| 5,318,025 | 6/1994 | Dumoulin et al. | 128/653.2 |
| 5,353,795 | 10/1994 | Souzar et al. | 128/653.2 |
| 5,523,746 | 6/1996 | Gallagher | 340/825.31 |
| 5,558,091 | 9/1996 | Acker et al. | 324/207.17 |
| 5,577,502 | 11/1996 | Darron et al. | 128/653.2 |

*Primary Examiner*—Sandra L. O'Shea
*Assistant Examiner*—Raymond Y. Mah
*Attorney, Agent, or Firm*—Jack D. Slobod

[57] ABSTRACT

A MR method determines nuclear magnetic resonance distribution in an examination area and the position of at least one microcoil which is located in the examination area in or on an examination object. In the presence of a homogeneous stationary magnetic field acting on the examination area, sequences are carried out in which at least one high-frequency pulse acting on the examination area is generated, and after the high-frequency pulse an MR signal induced in the microcoil is detected under the influence of a gradient magnetic field that acts on the examination area. Then the position of the microcoil in the gradient direction defined by the gradient field is derived from the detected MR signal. The aforementioned sequences are repeated for another gradient direction, and MR signals are detected by a further receiving coil arrangement to determine the nuclear distribution. Without additional measuring sequences, a position is detected in a manner that the sequences are continuously repeated while the gradient direction is varied, and that the position of the microcoil and the nuclear magnetic distribution are derived from MR signals detected simultaneously by the microcoil and the receiving coil arrangement.

5 Claims, 2 Drawing Sheets

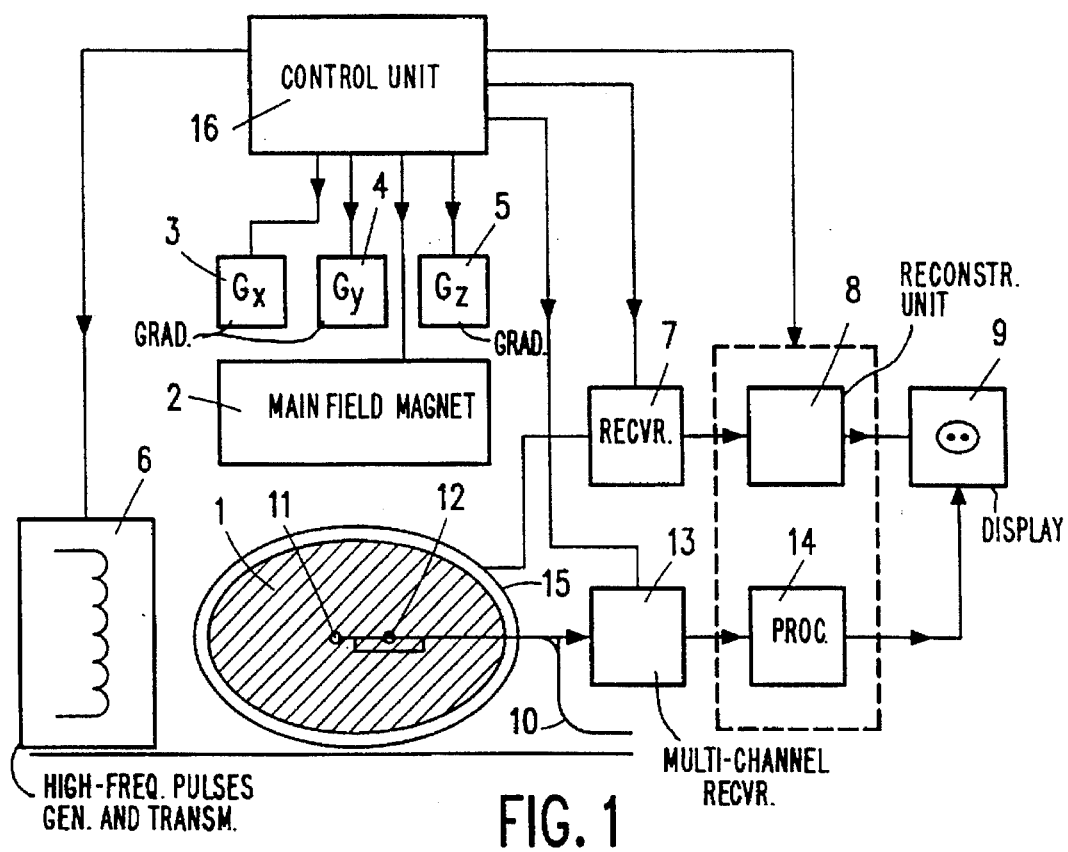
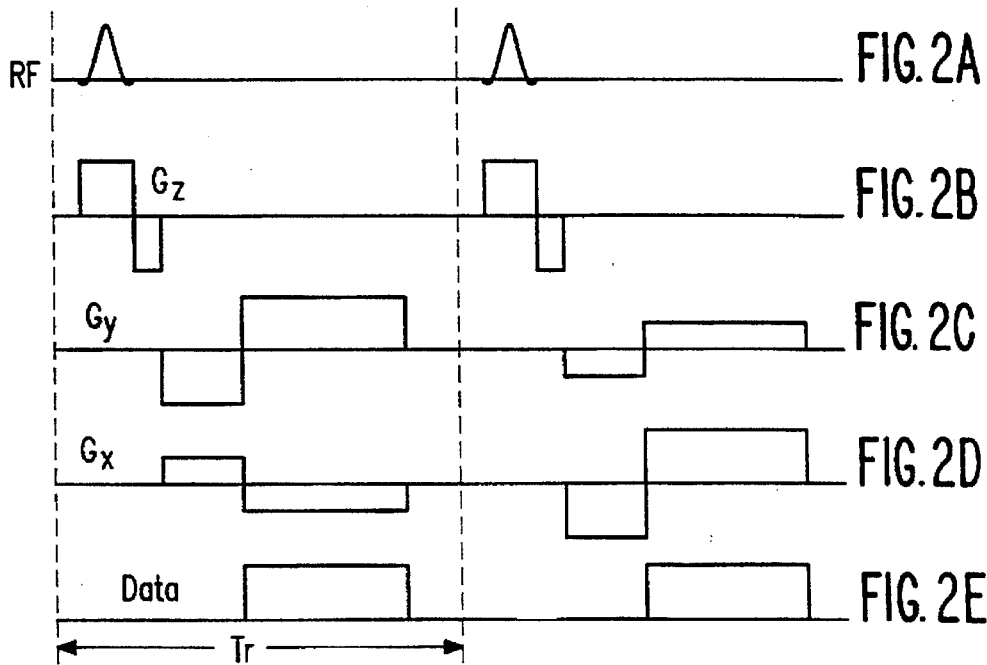

MR METHOD AND MR DEVICE FOR IMPLEMENTING THE METHOD

BACKGROUND OF THE INVENTION

1. Field of the Invention

The invention relates to a magnetic resonance (MR) method for determining a (MR) magnetic distribution in an examination area and for determining the position of at least one microcoil which is located in the examination area in or on an examination object, in which a) a homogeneous stationary magnetic field acts on the examination area, b) at least one high-frequency (RF) pulse acting on the examination area is generated, c) after the high-frequency RF pulse an MR signal induced in the microcoil is detected under the influence of a gradient magnetic field that acts on the examination d) the position of the microcoil in the gradient direction defined by the gradient field is derived from the detected MR signal, e) the steps and b) to d) are repeated for another gradient direction, and f) MR signals are detected by a further receiving coil arrangement to determine the MR distribution, and relates to an arrangement for implementing this method.

A microcoil is denoted here and in the following as a coil that can only receive MR signals from an area that is small compared to the overall examination area. The gradient direction is denoted as the direction in which the gradient of the gradient magnetic field runs.

2. Description of the Related Art

An MR method of the type defined in the opening paragraph is known from U.S. Pat. No. 5,318,025. One or various microcoils is/are connected to an instrument, for example, a catheter, inserted into the body of a patient. The position of the microcoil is determined by three consecutive sequences which comprise a high-frequency pulse, after which an MR signal is received under the influence of a gradient magnetic field. The gradient directions for these three sequences correspond to the x, y and z direction. The spectrum of the MR signal, which corresponds to the Fourier transformation of the MR signal, has a maximum in the gradient direction in the examination area at the position from where the microcoil can detect an MR signal. In this manner the position of the microcoil can be monitored by determining the maxima in the three gradient directions.

Monitoring the position may be continued as long as this is desired. Alternatively, an additional receiver coil arrangement determines the MR data from which the MR distribution in the examination area i.e. an MR image, can be derived. The MR position data and the MR image data may also be determined in alternating fashion. The position data may then be superimposed on the generated MR image, so that a viewer can continuously determine and recognize the position of the instrument (catheter) in the MR image.

A disadvantage is that the image data and the position data are to be derived from MR signals which were detected at different instants. When the position of the microcoil in the MR image is represented, there may be errors when the anatomy of the patient changes, for example, by a movement, or by a surgical operation. Furthermore, there is the disadvantage that the sequences necessary for finding the position are to be generated in addition to the sequences necessary for the imaging, so that the patient is burdened even more.

SUMMARY OF THE INVENTION

It is an object of the present invention to provide a method of the type defined in the opening paragraph, in that the described errors when the anatomy changes are largely avoided and the RF burden for the patient is reduced.

According to the invention this object is achieved in that the sequences comprising steps b) and c) are continuously repeated while the gradient direction is varied, and in that the position of the microcoil and the nuclear magnetic distribution are derived from MR signals simultaneously detected by the microcoil and the receiver coil arrangement.

It is essential to the invention that also when MR signals are detected from which the MR image of the examination area is derived, the gradient direction is changed from one sequence to the next. That is to say, the MR image data are acquired according to the so-called projection-reconstruction method which is known, for example from DE-OS 43 19 539 and in which no phase coding takes place between the high-frequency pulse(s) and the detection of the MR signal via a gradient field active during this time interval. Therefore, the position of the MR coil can continuously be derived from consecutive MR signals detected by the microcoil, while the receiver coil arrangement receives the MR signals for the MR image, without the need for increasing the number of sequences. The MR data for the MR image and for detecting the position are then obtained simultaneously, so that the described errors, for example, in the case of a movement of the examined subject are largely avoided.

Theoretically, the position of the microcoil can also be monitored when the gradient direction in consecutive sequences shows only a slight variation. In practice, however, errors then occur which are smaller as the angle between the gradient directions in consecutive sequences is larger; this error is minimized when the gradient directions used for detecting the position differ by 90°.

A further embodiment of the invention suitable in this respect for detecting the position in a two-dimensional area provides that the gradient direction is varied from one sequence to the next in such a way that two consecutive sequences form a pair whose gradient directions differ considerably, preferably by 90°.

An embodiment of the method which is suitable for the three-dimensional localization of the microcoil provides that the gradient direction is varied from one sequence to the next in such a way that three consecutive sequences form a triplet whose gradient directions differ considerably, preferably by 90°, while each gradient direction lies outside the planes defined by the other two gradient directions.

A possibility of applying the MR method according to the invention consists of detecting the respiratory condition via a microcoil that follows the respiratory movement of a patient who is positioned in the examination area.

An MR device for implementing the method according to the invention, comprising:

a) means for generating a homogeneous stationary magnetic field in an examination area, b) means for generating high-frequency pulses that act on the examination area, c) means for generating gradient magnetic fields that act on the examination area which fields have a controllable gradient direction, d) at least one microcoil for detecting MR signals, which is connected to a first receiver, e) a further receiver coil arrangement for detecting MR signals, which is connected to a second receiver, f) means for deriving the position of the microcoil from the MR signals detected by the first receiver, g) means for deriving the nuclear magnetic distribution from the MR signals detected by the second receiver, h) a control unit for controlling the further components of the MR device, is characterized in that the control unit which controls the two receivers and the means for generating the gradient magnetic fields in such a way that the sequences are continuously repeated while the gradient direction is varied and in that the position of the microcoil and the nuclear magnetic distribution are derived from MR signals simultaneously detected by the two receivers.

These and other aspects of the invention will be apparent from and elucidated with reference to the embodiments described hereinafter.

BRIEF DESCRIPTION OF THE DRAWINGS

In the drawings:

FIG. 1 shows an MR device by which the invention can be implemented,

FIG. 2 shows the time diagram of various signals in two consecutive sequences,

DETAILED DESCRIPTION OF THE PREFERRED EMBODIMENTS

Figure 3:
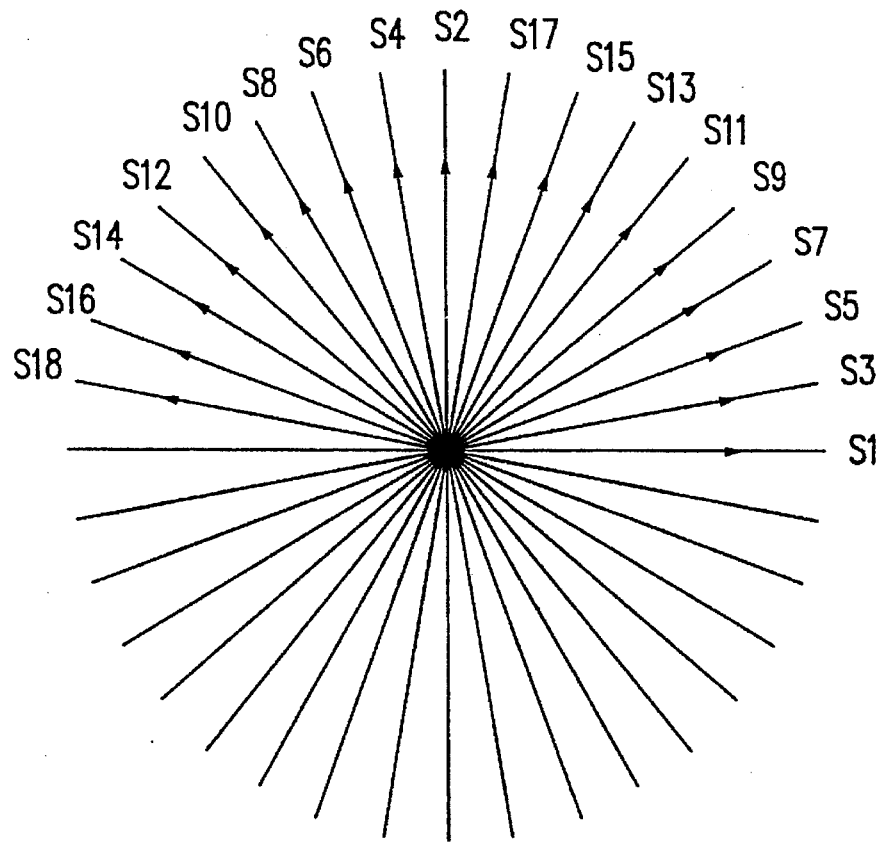
FIG. 3 shows the position of the paths along which the MR signals are detected in the k-area.

FIG. 1 shows an examination object referenced 1 which is positioned in an examination area which is exposed to a homogeneous stationary magnetic field generated by a main field magnet 2. The stationary homogeneous magnetic field can be modified by three gradient units 3, 4 and 5 which generate the gradient magnetic field that also runs in the direction of the homogeneous stationary magnetic field, but has a gradient in the x, y or z direction. Furthermore, a high-frequency (RF) pulse generation and transmitter 6 is provided which can generate a high-frequency pulsed magnetic field in the examination area.

The MR signals generated in the examination object are detected by a receiver coil unit 15 (which may comprise one or various receiver coils) connected to a receiver unit 7 (which may comprise one or various receiver channels). After a Fourier transformation, the nuclear magnetic distribution in the examination area is reconstructed in a reconstruction unit 8 on the basis of the digitized MR signals and displayed on a display unit 9 in the form of an MR image.

A surgical instrument, for example, a catheter 10 at whose top and, as required, at a further position, a microcoil 11 or 12 respectively, is attached, is inserted into the examination object 1. The microcoils 11 and 12 respectively, may have the structure described in FIG. 2a or FIG. 2b respectively, of U.S. Pat. No. 5,318,025. The signals produced by the microcoils 11, 12 are applied to a multichannel receiver unit 13 (as required, i.e. if a plurality of microcoils not combined in series are used) and, after a Fourier transformation, to a processing unit 14 which determines the maxima and derives the position of the microcoil (N) from two consecutive sequences and superimposes the position data on the MR image displayed on the display unit 9. As shown in a dashed line, the components 8 and 14 may be realized by a suitably programmed computer. The components 2 to 15 are controlled by a programmable control unit 16.

As shown in FIG. 2, the sequences are spaced in time by the intervals $T_r$ indicated in a dashed line. In each sequence a high-frequency pulse is generated (first line) which is accompanied by a layer selection gradient, for example, by the gradient $G_z$ (second line) generated by the gradient arrangement 5. After the high-frequency pulse, the two gradients $G_y$ and $G_x$ which are perpendicular to the layer selection gradient are used (third and fourth line of FIG. 2), while the polarity of the gradient changes after a predefined period of time. After the change, the MR signal is detected as long as the gradient fields $G_x$, $G_y$ are active. These gradient fields will also be referenced "reading gradients" in the following. In the time diagram shown of these gradient fields this means that when the MR signal is detected, the k-space is scanned along a straight line which runs through the zero point of the k-space and is symmetrical with the zero point.

For the next sequence, the high-frequency pulse (first line), the layer selection gradient (second line), and the scanning interval (fifth line) have the same time-dependent variation or the same time-dependent position respectively, in the sequence, but the reading gradients $G_x$, $G_y$ (third and fourth line) are changed in such a way that their magnitude has the same value as in the previous sequence, but their gradient direction has changed by 90°. The two sequences shown in FIG. 2 thus form a pair whose gradient directions form a 90° angle. In the subsequent sequences, the gradient direction is varied in such a way that each time two consecutive sequences form a pair having a gradient direction shifted by 90° until the k-space has been completely scanned once. Subsequently, the order of the sequences is repeated as long as the monitoring of the catheter 10 is necessary.

FIG. 3 shows the paths along which the k-space is scanned in the individual sequences. S1 then stands for the first sequence, S2 for the second sequence, and so on. It will be recognized that S1 and S2 form a pair having a gradient direction shifted by 90°, as do S3 and S4 as well as S5 and S6, and so on.

Since the MR signals are read under the influence of a reading gradient ($G_x$, $G_y$), the frequency of these signals is changed linearly with the position of its origin relative to the gradient direction. Since the microcoils can detect MR signals only from the area in their immediate vicinity, whereas they are practically insensitive to MR signals from more distant areas, this means that the MR signal induced into a microcoil has practically only one frequency that depends on the position of the microcoil. This frequency can be derived from the spectrum of the MR signal (i.e. from the Fourier transform of the MR signal) as the position at which the spectrum has its maximum value. In this manner, the position of the microcoil in the gradient direction can be determined on the basis of the frequency analysis of the MR signal. This is described in detail in U.S. Pat. No. 5,318,025 to which reference is expressly made.

Figure 4:
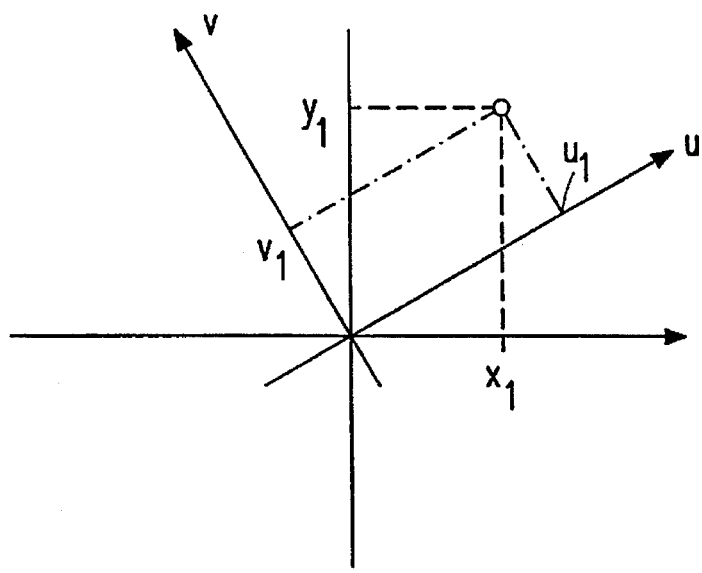
FIG. 4 shows the position-monitoring of a microcoil based on the position data detected by two consecutive measurements.

FIG. 4 explains the exact localization of the microcoil. x and y then refer to a fixed system of coordinates within which system the nuclear magnetic distribution is determined and u and v refer to the gradient directions of two consecutive sequences, for example, the sequences S5 and S6. $u_1$ is then assumed to be the position of the microcoil determined in the fifth sequence in gradient direction, and $v_1$ is assumed to represent the position determined for the sixth sequence. In that case the position M of the microcoil is the point of intersection of the lines perpendicularly intersecting axes u and v at the points $u_1$ and $v_1$. Since the gradient directions u and v are predefined for the individual sequences, the position $x_1$, $y_1$ in the fixed system of xy-coordinates can be determined therefrom. This position can be superimposed on the MR image on the display unit 9.

Basically, it is not necessary for the gradient directions of the sequences forming pairs to be perpendicular to each other; theoretically, the position of the microcoil can also be determined when the gradient directions u and v differ by only a small angle, but the inaccuracy in the determination of the position is larger as the angle between the gradient directions deviates more from 90°. Therefore, the angle between the gradient directions is to exceed 30°, particularly exceed 60°, and preferably be 90°.

For generating an MR image of the nuclear magnetic distribution on the basis of the MR signals of the receiver coil arrangement, it is generally necessary to have N MR signals, where N is considerably larger than appears from FIG. 3 and is, for example, 128. The period of time necessary for a completely new MR image of the nuclear magnetic distribution is thus $NT_r$. When the nuclear magnetic distribution is reconstructed, however, the MR image is continuously completed by the newly added projections (a projection is the Fourier transform of an MR signal), in that the difference is formed between this projection and the projection determined for the same gradient direction—N sequences prior thereto—and an updated nuclear magnetic distribution is determined from this difference. An advantage is then that each projection for the whole examination area contains both high-frequency and low-frequency information elements.

Although it takes a relatively long time before the MR image of the nuclear magnetic distribution changes, the position of the microcoil can be recomputed after each sequence pair, and superimposed on the MR image. The position of the MR coil is thus updated considerably more rapidly than the MR images, that is, after each period of time $2T_r$.

If the microcoil position is to be updated still more rapidly, it is also possible with a suitable sequence of gradient directions to use sequences that do not form a pair. Accordingly, the first position would be detected on the basis of the sequences S1 and S2, whereas the next position would not be detected on the basis of the next pair (S3–S4), but already on the basis of S2 and S3. The signals necessary for computing the new microcoil position are then already acquired after the period of time $T_r$. The angle between S2 and S3 is not exactly 90°, though, but slightly smaller; nevertheless, it is still possible to have a reliable detection of the microcoil position, as has been explained above.

For the sequence explained with reference to FIGS. 2 to 4 it is only possible to determine the microcoil position in a layer determined by the layer-selective high-frequency pulse of each sequence i.e. in a two-dimensional area. However, it is alternatively possible to change the sequence in such a way that the nuclear magnetic distribution and the microcoil position are determined three-dimensionally. For this purpose, the gradient $G_z$ must not be active during the high-frequency pulse, but it must act on the examination area while the MR signal is read—as must the gradients $G_y$ and $G_x$. While the paths, along which the MR signals are scanned in the k-area with the two-dimensional method, define the circumference of a circle (compare FIG. 3), the end points of the paths in a three-dimensional method are to define the surfaces of a sphere. The gradient directions are then to be varied in such a way that three consecutive sequences each time form a triplet. In this triplet each gradient direction is to form a sufficiently large angle i.e. an angle exceeding 30°, preferably exceeding 60° and particularly being 90° relative to the other two gradient directions—and relative to the plane defined by these gradient directions.

One (or various) microcoils has been used above for the purpose of monitoring the position of a surgical instrument, for example, a catheter in the body of the examination object 1. However, it is alternatively possible, for example, for movement studies of a (knee) joint, to put microcoils, for example, on the upper and lower leg and utilize the resulting position information for evaluating the MR image.

A further application of the method according to the invention consists of determining the respiratory condition that exists at the instant when MR signals necessary for an MR image are acquired. For this purpose, a microcoil is fixed to the breast of a patient. The microcoil follows the respiratory movement, so that the respiratory condition can be derived from the position of the microcoil and can be visualized by the MR image.

We claim:

1. A MR method for determining the nuclear magnetic distribution in an examination area and for determining the position of at least one microcoil which is located in the examination area in or on an examination object, in which a) a homogeneous stationary magnetic field acts on the examination area, b) at least one high-frequency pulse acting on the examination area is generated, c) after the high-frequency pulse an MR signal induced in the microcoil is detected under the influence of a gradient magnetic field that acts on the examination area, d) the position of the microcoil in the gradient direction defined by the gradient field is derived from the detected MR signal, e) the steps and b) to d) are repeated for another gradient direction, and f) MR signals are detected by a further receiving coil arrangement to determine the nuclear magnetic distribution, and relates to an arrangement for implementing this method, wherein the sequences comprising steps b) and c) are continuously repeated while the gradient direction is varied and the position of the microcoil and the nuclear magnetic distribution are derived from MR signals simultaneously detected by the microcoil and the receiver coil arrangement.

2. A MR method as claimed in claim 1, wherein the gradient direction is varied from one sequence to the next in such a way that two consecutive sequences (for example, $S_1$, $S_2$) form a pair whose gradient directions differ considerably.

3. A MR method as claimed in claim 1, wherein the gradient direction is varied from one sequence to the next in such a way that three consecutive sequences form a triplet whose gradient directions differ considerably, while each gradient direction lies outside the planes defined by the other two gradient directions.

4. A implementation of the MR method as claimed in claim 1, for detecting the respiratory condition via a microcoil that follows the respiratory movement of a patient positioned in the examination area.

5. A MR device comprising:

a) means for generating a homogeneous stationary magnetic field in an examination area, b) means for generating high-frequency pulses that act on the examination area, c) means for generating gradient magnetic fields that act on the examination area which fields have a controllable gradient direction, d) at least one microcoil for detecting MR signals, which is connected to a first receiver that has a number of receiving channels corresponding to the number of microcoils, e) a further receiver coil arrangement for detecting MR signals, which is connected to a second receiver, f) means for deriving the position of the microcoil from the MR signals detected by the first receiver, g) means for deriving a nuclear magnetic distribution from the MR signals detected by the second receiver and, h) a control unit for controlling components of the MR device including the means for generating the high-frequency pulse and the means for generating the gradient magnetic fields, wherein the control unit controls the receivers (7, 13) and the means for generating the gradient magnetic fields in such a way that the sequences are continuously repeated while the gradient direction is varied, and the position of the microcoil and the nuclear magnetic distribution are derived from MR signals simultaneously detected by the receivers.

* * * * *